(12) United States Patent
Wang et al.

(10) Patent No.: US 9,490,827 B2
(45) Date of Patent: *Nov. 8, 2016

(54) APPARATUS AND METHODS FOR TUNING A VOLTAGE CONTROLLED OSCILLATOR

(71) Applicant: Skyworks Solutions, Inc., Woburn, MA (US)

(72) Inventors: Hua Wang, High Point, NC (US); David Steven Ripley, Marion, IA (US); Bryan J. Roll, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,465

(22) Filed: Apr. 27, 2015

(65) Prior Publication Data

US 2015/0326233 A1   Nov. 12, 2015

Related U.S. Application Data

(63) Continuation of application No. 14/101,094, filed on Dec. 9, 2013, now Pat. No. 9,042,854, which is a continuation of application No. 11/267,797, filed on Nov. 4, 2005, now abandoned.

(51) Int. Cl.
*H03B 5/12* (2006.01)
*H03L 7/099* (2006.01)
(Continued)

(52) U.S. Cl.
CPC ............ *H03L 7/0992* (2013.01); *H03L 7/099* (2013.01); *H03L 7/10* (2013.01); *H03L 7/18* (2013.01); *H03L 7/187* (2013.01); *H03L 7/193* (2013.01)

(58) Field of Classification Search
CPC ........... H03B 1/00; H03L 7/099; H03L 7/10; H03L 7/187; H03L 7/193; H03L 7/18; H03L 7/0992

USPC ................ 331/34, 177 V, 167, 17, 16, 36 C; 327/156

See application file for complete search history.

(56) References Cited

U.S. PATENT DOCUMENTS

| 5,289,506 A | 2/1994 | Kitayama et al. |
| 5,982,840 A | 11/1999 | Aisaka |

(Continued)

FOREIGN PATENT DOCUMENTS

| EP | 1189351 A2 | 3/2002 |
| EP | 1460762 A1 | 9/2004 |

(Continued)

OTHER PUBLICATIONS

International Search Report for PCT Application No. PCT/US2006/040284, dated May 11, 2007 (1 page).

(Continued)

*Primary Examiner* — Arnold Kinkead
(74) *Attorney, Agent, or Firm* — Knobbe, Martens, Olson & Bear, LLP

(57) ABSTRACT

Apparatus and methods for tuning a voltage controlled oscillator (VCO) are provided. In one aspect, a method of auto-tuning in a phase-locked loop includes generating a VCO clock signal using a VCO coupled to a capacitor array, dividing the VCO clock signal to generate a divided clock signal using a prescaler circuit having a selectable division ratio, controlling a value of the selectable division ratio using a first counter and a second counter of a counter module, generating a phase-frequency detector feedback signal based on a division control signal M and the divided clock signal using the counter module, counting a number of cycles of the divided clock signal that occur during a calibration interval using a cycle counter of a digital processing logic circuit, and determining the value of a capacitor array control signal based on the number of cycles counted during the calibration interval.

17 Claims, 3 Drawing Sheets

(51) Int. Cl.
*H03L 7/10* (2006.01)
*H03L 7/187* (2006.01)
*H03L 7/193* (2006.01)
*H03L 7/18* (2006.01)

(56) References Cited

U.S. PATENT DOCUMENTS

| | | |
|---|---|---|
| 6,566,966 B1 | 5/2003 | Bellaouar et al. |
| 9,042,854 B2 * | 5/2015 | Wang ............... H03L 7/099 455/260 |
| 2001/0024943 A1 | 9/2001 | Welland |
| 2003/0224749 A1 | 12/2003 | Uozumi et al. |
| 2004/0008805 A1 | 1/2004 | Xiu et al. |
| 2005/0231297 A1 | 10/2005 | Aparin et al. |
| 2006/0003720 A1 | 1/2006 | Lee et al. |

FOREIGN PATENT DOCUMENTS

| | | |
|---|---|---|
| EP | 1551102 A1 | 7/2005 |
| EP | 1583221 A1 | 10/2005 |
| FR | EP 1460762 A1 * | 9/2004 ............ H03L 7/099 |
| WO | WO 03.077422 A2 | 9/2003 |

OTHER PUBLICATIONS

International Preliminary Report on Patentability for PCT Application No. PCT/US2006/040284, dated May 6, 2008 (6 pages).
Supplemental European Search Report for European Application No. 06825983, dated Sep. 11, 2008 (4 pages).
U.S. Appl. No. 11/267,797, High Resolution Auto-Tuning for a Voltage Controlled Oscillator, filed Nov. 4, 2005.
PCT/US2006/040284, High Resolution Auto-Tuning for a Voltage Controlled Oscillator, Oct. 13, 2006.
KR 10-2008-7013431, High Resolution Auto-Tuning for a Voltage Controlled Oscillator, Oct. 13, 2006.
EP20060825983, High Resolution Auto-Tuning for a Voltage Controlled Oscillator, Oct. 13, 2006.
U.S. Appl. No. 14/101,094, Apparatus and Methods for Tuning a Voltage Controlled Oscillator, filed Dec. 9, 2013.

* cited by examiner

APPARATUS AND METHODS FOR TUNING A VOLTAGE CONTROLLED OSCILLATOR

INCORPORATION BY REFERENCE TO ANY PRIORITY APPLICATIONS

This application is a continuation of U.S. patent application Ser. No. 14/101,094, filed Dec. 9, 2013, entitled "APPARATUS AND METHODS FOR TUNING A VOLTAGE CONTROLLED OSCILLATOR," which is a continuation of U.S. patent application Ser. No. 11/267,797, filed Nov. 4, 2005, entitled "HIGH RESOLUTION AUTO-TUNING FOR A VOLTAGE CONTROLLED OSCILLATOR." Any and all applications for which a foreign or domestic priority claim is identified in the Application Data Sheet as filed with the present application are hereby incorporated by reference under 37 CFR 1.57.

BACKGROUND OF THE INVENTION

1. Field of the Invention

The present invention is generally in the field of electrical circuits. More particularly, the invention is in the field of voltage controlled oscillators.

2. Description of the Related Art

Voltage controlled oscillators ("VCOs"), such as VCOs used in wireless communications devices, typically require a wide tuning range to cover desired frequency bands and channel bandwidths as well as frequency alterations due to process variations. VCOs that employ LC tank circuits typically use varactors for continuous frequency tuning. However, using large varactors for continuous tuning over a wide frequency range can cause a large VCO gain, which undesirably increases sensitivity to noise and disturbances on the control voltage. To solve this problem, a small varactor can be used in combination with a switched capacitor array to achieve digital tuning (i.e. coarse tuning) and continuous tuning (i.e. fine tuning). Either digital tuning or continuous tuning requires a closed loop to implement a desirable auto-tuning function.

Current digital auto-tuning approaches however, have a number of significant drawbacks. One conventional approach uses a separate high speed divider with a fixed division ratio for VCO digital auto-tuning. However, in this approach, the fixed division ratio of the high speed divider reduces resolution and the separate high speed divider increases semiconductor die size and cost. Another conventional VCO digital auto-tuning approach utilizes an analog frequency comparator, which is difficult to design with high resolution and low cost. Other conventional VCO digital auto-tuning approaches have undesirable features such long tuning time and/or limited resolution.

Thus, there is a need in the art for a low cost, high resolution digital auto-tuning circuit for a VCO.

SUMMARY OF THE INVENTION

The present invention is directed to a high resolution auto-tuning circuit for a voltage controlled oscillator. The present invention overcomes the need in the art for a low cost, high resolution digital auto-tuning circuit for a voltage controlled oscillator.

According to one exemplary embodiment, an auto-tuning circuit coupled to a voltage controlled oscillator in a phase locked loop, where the voltage controlled oscillator is coupled to a capacitor array, includes a prescaler circuit configured to receive a voltage controlled oscillator frequency from the voltage controlled oscillator and provide a divided voltage controlled oscillator frequency, where the prescaler circuit is used in the phase locked loop during fine tuning of the voltage controlled oscillator in the auto-tuning circuit during coarse tuning of the voltage controlled oscillator. The auto-tuning circuit causes the voltage controlled oscillator to have an approximate coarse tuning target frequency. The auto-tuning circuit provides a voltage reference signal to an input of the voltage controlled oscillator during coarse tuning of said voltage controlled oscillator, where the voltage reference signal is proportional to temperature. The prescaler circuit comprises a selectable division ratio.

According to one exemplary embodiment, the auto-tuning circuit further includes a digital processing logic circuit coupled to the prescaler circuit. The digital processing logic circuit is configured to determine a capacitance of the capacitor array by comparing a comp_cnt to a pre-determined value, where the comp_cnt is determined by a number of cycles of the divided voltage controlled oscillator frequency that occur in a calibration interval. The pre-determined value is equal to a product of M and Q, where M is a division ratio of an M counter in the phase locked loop and Q is a division ratio in the digital processing logic circuit.

According to this exemplary embodiment, the calibration interval is equal to Q divided by a frequency of a reference clock, wherein the reference clock is inputted into the digital processing logic circuit. The prescaler circuit can be further configured to receive a mode control signal from an N counter module in the phase locked loop, wherein the mode control signal determines a division ratio of the prescaler circuit, wherein the N counter comprises the M counter. The capacitance of the capacitor array can be determined by a final capacitor array control signal, where the final capacitor array control signal is coupled to the capacitor array. The final capacitor array control signal can include a number of bits, where each of the bits of the final capacitor array control signal is determined by the product of M and Q. According to another embodiment, the invention includes a method for coarse tuning a voltage controlled oscillator using the auto-tuning circuit discussed above. Other features and advantages of the present invention will become more readily apparent to those of ordinary skill in the art after reviewing the following detailed description and accompanying drawings.

DETAILED DESCRIPTION OF THE PREFERRED EMBODIMENT

The present invention is directed to a high resolution auto-tuning circuit for a voltage controlled oscillator. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
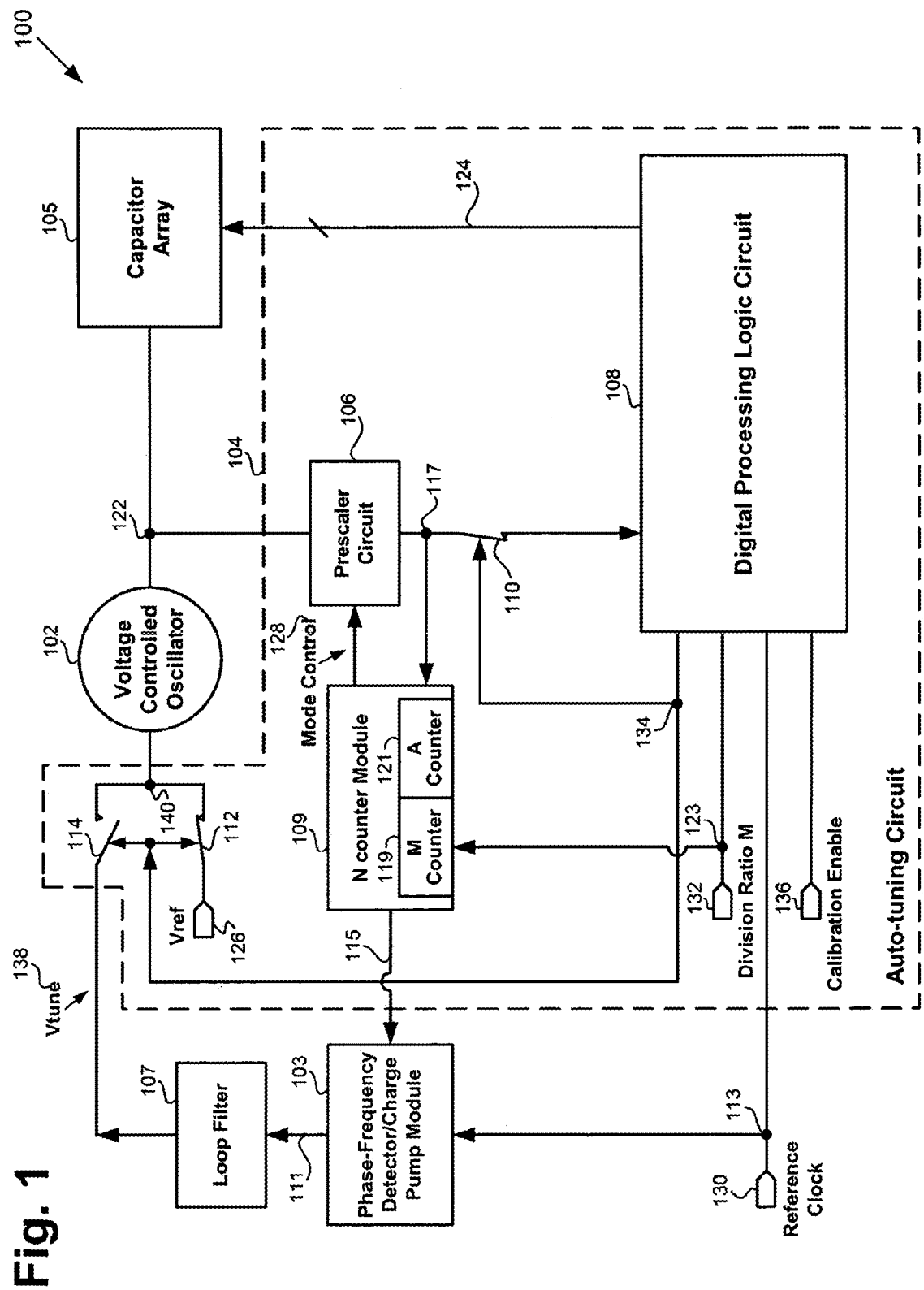
FIG. 1 is a block diagram of an exemplary phase locked loop module including an exemplary VCO coupled to an exemplary auto-tuning circuit in accordance with one embodiment of the present invention.

FIG. 1 shows a block diagram of an exemplary phase locked loop including and exemplary VCO coupled to an exemplary auto-tuning circuit and an exemplary capacitor array in accordance with one embodiment of the present invention. Certain details and features have been left out of FIG. 1 that are apparent to a person of ordinary skill in the art. Phase locked loop 100 includes VCO 102, phase-frequency detector/charge pump module 103, auto-tuning circuit 104, capacitor array 105, prescaler circuit 106, which is also used in auto-tuning circuit 104, loop filter 107, and N counter module 109. Auto-tuning circuit 104 further includes prescaler circuit 106, digital processing logic circuit 108, and switches 110, 112, and 114.

As shown in FIG. 1, phase-frequency detector/charge pump module 103 is coupled to loop filter 107 via line 111. Phase-frequency detector/charge pump module 103 can be configured to receive reference clock 130 at one input and a feedback signal from N counter module 109 via line 115 at another input, compare the phase of reference clock 130 with the phase of the feedback signal, and generate a correction signal, which is outputted to loop filter 107 via line 111. Loop filter 107 can be configured to receive the correction signal from phase-frequency detector/charge pump 103 and output tuning voltage ("Vtune") 138, which is coupled to the input of VCO 102 at node 140 when switch 114 is closed.

Also shown in FIG. 1, auto-tuning circuit 104 is coupled to an output of VCO 102 and a first terminal of capacitor array 105 at node 122 and coupled to a second terminal of capacitor array 105 via line 124. Auto-tuning circuit 104 is a digital auto-tuning circuit that can be configured to provide coarse tuning for VCO 102 by providing voltage reference signal ("Vref") 126 at an input of VCO 102, receiving an output signal of VCO 102 at node 122, calibrating a capacitor array control signal, and providing the capacitor array control signal to capacitor array 105 via line 124 so as to cause VCO 102 to have an approximate coarse tuning target frequency.

Capacitor array 105 is a switched capacitor array comprising "k" capacitors (not shown in FIG. 1) coupled together in parallel, where "k" is determined by the equation:

k=integer ($\log_2$ (tuning range in %/measuring resolution)+0.5) equation (1) where "k" is rounded off to a nearest integer number, "tuning range in %" is a desired tuning range of VCO 102 as measured in percent, and "measuring resolution" is a desired measuring resolution of capacitor array 105. Thus, for example, for a "tuning range in %" equal to 20.0 percent (i.e. 0.2) and a "measuring resolution" equal to 1.0/1000.0, "k" would be equal to 8. Thus, in the above example, capacitor array 105 would comprise 8 switchable capacitors coupled together in parallel.

The measuring resolution determines how accurately the frequency of VCO 102 can be measured. The frequency of VCO 102 can be measured by using prescaler 106 to divide the output frequency of VCO 102 and provide a divided (i.e. scaled down) frequency of VCO 102 ("a divided VCO frequency"), which can be compared to reference clock 130 by counting the number of edges of the divided VCO frequency that occur within a specified time period. Thus, the accuracy with which the frequency of VCO 102 can be measured is a function of time in that to achieve increased accuracy a greater amount of time is required to measure an appropriate number of edges of the divided VCO frequency. Thus, by utilizing prescaler 106, which has a dual modulus, in place of a fixed divider, the present invention achieves increased frequency measurement accuracy in a reduced amount of time. However, the accuracy with which the frequency of VCO 102 can be adjusted is determined by the resolution of capacitor array 105, which is determined by k. Thus, in the present invention's auto-tuning circuit, the resolution of prescaler 106 and the resolution of capacitor array 105 are balanced to achieve a balance in accuracy of measuring the frequency of VCO 102 and accuracy in adjusting the frequency of VCO 102.

Each capacitor (not shown in FIG. 1) in capacitor array 105 is also coupled in series with a switch (not shown in FIG. 1) such that the capacitor can be activated when the switch is closed and deactivated when the switch is closed. Thus, the capacitance of capacitor array 105 is equal to the sum of the capacitances of the respective activated capacitors in capacitor array 105. The capacitance of capacitor array 105 is determined by a capacitor array control signal inputted into capacitor array 105 by auto-tuning circuit 104 via line 124. The capacitor array control signal is a digital word that comprises k bits, where each bit controls a switch that controls an associated capacitor. In the present embodiment, when the value of a bit in capacitor array control signal is set "1", a corresponding capacitor in capacitor array 105 is activated, and the value of a bit in the capacitor array control signal is set to "0", a corresponding capacitor in capacitor array 105 is deactivated. In another embodiment, a respective bit value of "0" or "1" may be used in the capacitor array control signal to activate or deactivate a corresponding capacitor in capacitor array 105.

In the present embodiment, the capacitances of the respective capacitors (not shown in FIG. 1) in capacitor array 105 are selected to sequentially decrease in value such that the capacitor associated with the most significant bit ("MSB") of the capacitor array control signal has the largest capacitance and the capacitor associated with least significant bit ("LSB") of the capacitor array control signal has the smallest capacitance. In another embodiment, the capacitors in capacitor array 105 and their respective capacitances may have a different arrangement.

Also shown in FIG. 1, one input of prescaler circuit 106 is coupled to the output of VCO 102 at node 122, another input of prescaler circuit 106 is coupled to an output of N counter Module 109, and an output of prescaler circuit 106 is coupled to a first terminal of switch 110 and an input of N counter module 109 at node 117. Prescaler circuit 106 is a prescaler circuit that comprises a selectable division ratio (i.e. prescaler circuit 106 does not have a fixed division ratio). In the present embodiment, prescaler circuit 106 can comprise a dual modulus. In another embodiment, prescaler circuit 106 can be a different type of prescaler having a selectable division ratio. Prescaler circuit 106 can be configured to receive an output signal of VCO 102 and mode control signal 128 from N counter module 109, divide the frequency of VCO 102 by a division ratio that is selected by mode control signal 128, and output a divided VCO frequency.

The division ratio of prescaler circuit 106, which is determined by mode control signal 128, can be, for example, P or P+1, where P is an integer number. By utilizing a prescaler circuit that has a selectable division ratio, the present invention advantageously achieves a divided VCO frequency having increased resolution compared to a conventional coarse tuning circuit that uses a divider circuit having a fixed division ratio to scale down the VCO frequency. Prescaler circuit 106 is also utilized in combination with phase-frequency detector/charge pump module 103, loop filter 107, and N counter module 109 in phase locked loop 100 to provide continuous tuning (i.e. fine tuning) for VCO 102. Thus, by utilizing a prescaler circuit (i.e. prescaler circuit 106) that comprises a dual modulus and is already utilized to provide continuous tuning in phase locked loop 100, the present invention advantageously achieves an auto-tuning circuit that provides high resolution while advantageously saving semiconductor die space by not requiring an additional high-speed counter circuit. Also, the present invention's auto-tuning circuit saves current drain by utilizing prescaler circuit 106, since prescaler circuit 106 is already on and utilized during continuous tuning operation in phase locked loop 100.

Further shown in FIG. 1, N counter module 109 is coupled to prescaler circuit 106 and phase-frequency detector/charge pump module 103. N counter module 109 includes M counter 119 and A counter 121. The M counter is coupled to division ratio M 132 and an input of digital processing logic circuit 108 at node 123. N counter module 109 can be configured to receive division ratio M 132 at one input and the output of prescaler 106 at another input and provide a feedback signal to phase-frequency detector/charge pump module 103 at one output via line 115 and provide mode control signal 128 to prescaler circuit 106 at another output. M counter 119 operates in combination with A counter 121 in a manner known in the art to generate mode control signal 128. Also shown in FIG. 1, a second terminal of switch 110 is coupled to an input of digital processing logic circuit 108 and a third terminal (i.e. a control terminal) of switch 110 is coupled an output of digital processing logic circuit 108 at node 134. Switch 110 can be configured to be closed when auto-tuning circuit 104 is activated (i.e. during coarse tuning of VCO 102) and open when auto-tuning circuit 104 is not activated (e.g. during fine tuning of VCO 102).

Further shown in FIG. 1, reference clock 130 is coupled to an input of phase-frequency detector/charge pump module 103 and an input of digital processing logic circuit 108 at node 113. Digital processing logic circuit 108 can be configured to receive reference clock 130 and divide a frequency of reference clock 130 by division ratio Q to determine a divided frequency of reference clock 130 ("a divided reference clock frequency"). Digital processing logic circuit 108 can be further configured to receive division ratio M (also referred to simply as "M") and a divided VCO frequency via prescaler circuit 106, and compare comp_cnt to M•Q, which is a pre-determined value, so as to determine a final capacitor array control signal for capacitor array 105, where comp_cnt is the number of cycles of the divided VCO frequency that occur during a calibration interval, "Q" is the division ratio used by digital processing logic circuit 108 to divide reference clock 130, and "M" is the division ratio of M counter 119 in phase locked loop 100. The calibration interval utilized by digital processing logic circuit 108 is equal to $Q/F_{ref}$, where "$F_{ref}$" is the frequency of reference clock 130. In one embodiment, Q can be approximately equal to P, which is a division ratio utilized in prescaler circuit 106. The final capacitor array control signal determined by digital processing logic circuit 108 determines a final coarse tuning capacitance of capacitor array 105. The operation of digital processing logic circuit 108 will be further discussed below in relation to FIG. 2.

Also shown in FIG. 1, one output of digital processing logic circuit 108 is coupled to capacitor array 105 via line 124 and another output of digital processing logic circuit 108 is coupled to control terminals of switches 110, 112, and 114 at node 134. Digital processing logic circuit 108 can be further configured to output the final capacitor array control signal to capacitor array 105 via line 124. Each bit of capacitor array control signal is calibrated by digital processing logic circuit 108 so as to achieve an approximate final coarse tuning capacitance of capacitor array 105. The final coarse tuning capacitance of capacitor array 105 provides an approximate target frequency of VCO 102, which corresponds to the condition when comp_cnt equals M•Q. Digital processing logic circuit 108 is further configured to provide a coarse tuning control signal at node 134, which causes switches 110 and 112 to close and switch 114 to open at the start of coarse tuning of VCO 102 and causes switches 110 and 112 to open and switch 114 to close after completion of the coarse tuning of VCO 102. Also shown in FIG. 1, calibration enable signal 136 is coupled to digital processing logic circuit 108 and is configured to initiate the start of coarse tuning of VCO 102 by enabling digital processing logic circuit 108.

Further shown in FIG. 1, a first terminal of switch 114 is coupled to the output of loop filter 107, a second terminal of switch 114 is coupled to a first terminal of switch 112 and an input of voltage controlled oscillator 102 at node 140, and a second terminal of switch 112 is coupled to Vref 126. During coarse tuning of voltage controlled oscillator 102, switch 112 can be configured to connect Vref 126 to node 140 (i.e. an input of voltage controlled oscillator 102) and switch 114 can be configured to disconnect Vtune 138 from node 140 (i.e. open a fine tuning loop of phase locked loop 100). During continuous tuning (i.e. fine tuning) of voltage controlled oscillator 102, switch 112 can be configured to disconnect Vref 126 from node 140 and switch 114 can be configured to connect the Vtune 138, which is outputted by loop filter 107, to node 140. Thus, by opening switch 114 to disconnect the output of loop filter 107 from node 140, phase locked loop 100 is opened during coarse tuning of VCO 102 by auto-tuning circuit 104.

In the present invention, Vref 126 is temperature compensated to reduce temperature variation coverage of VCO 102 during fine tuning of VCO 102. Vref 126 is proportional to temperature so as to have a higher value when temperature increases and a lower value when temperature decreases. As a result, VCO 102 advantageously requires less gain to cover a wider temperature range during fine tuning operation. The operation of auto-tuning circuit 104 will now be discussed with reference to FIG. 2.

Figure 2:
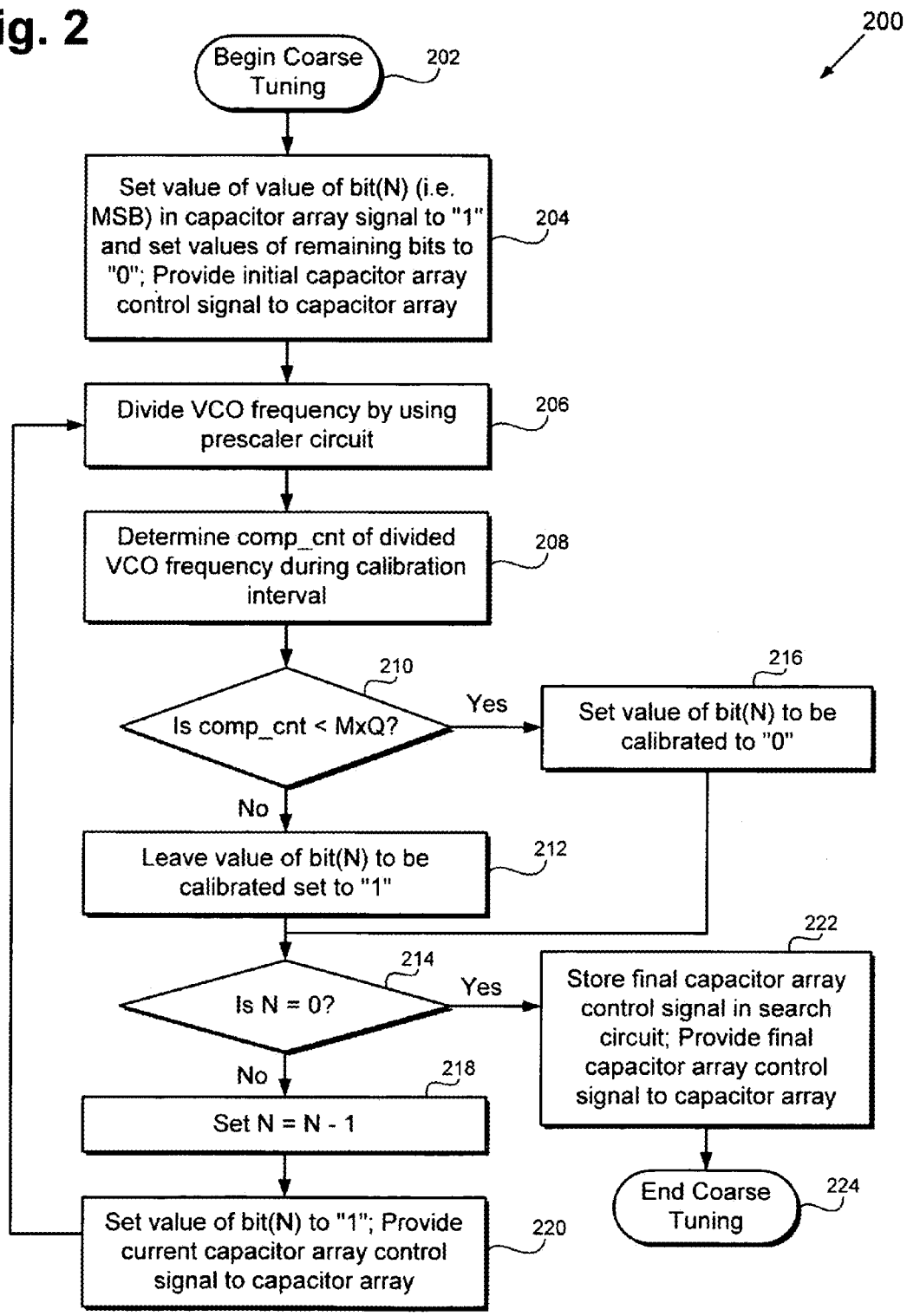
FIG. 2 shows a flowchart illustrating an exemplary method of coarse tuning a VCO in accordance with one embodiment of the present invention.

FIG. 2 shows a flowchart illustrating an exemplary method of coarse tuning VCO 102 in FIG. 1 according to an embodiment of the present invention. Certain details and features have been left out of flowchart 200 that are apparent to a person of ordinary skill in the art. For example, a step may consist of one or more substeps or may involve specialized equipment or materials, as known in the art. Steps 202 through 222 indicated in flowchart 200 are sufficient to describe one embodiment of the present invention, other embodiments of the invention may utilize steps different from those shown in flowchart 200.

At step of 202 of flowchart 200, the method of coarse tuning VCO 102 in FIG. 1 by auto-tuning circuit 104 begins with activation of digital processing logic circuit 108 by calibration enable signal 136. After digital processing logic circuit 108 has been activated, a coarse tuning control signal outputted by digital processing logic circuit 108 causes Vref 126 to be connected to an input of VCO 102, Vtune 138 to be disconnected from the input of VCO 102, and the output of prescaler circuit 106 to be coupled to an input of digital processing logic circuit 108. At step 204, a value of the MSB (bit(N), where N=k-1) of the capacitor array control signal is set to "1" and the values of the remaining N-1 bits of the capacitor array control signal are set to "0" to provide an initial capacitor array control signal, which is inputted into capacitor array 105. The initial capacitor array control signal determines an initial coarse tuning capacitance of capacitor array 105.

At step 206, the frequency of VCO 102 is divided by prescaler circuit 106, which does not have a fixed division ratio. For example, prescaler circuit 106 can be a modulus two prescaler circuit. At step 208, comp_cnt, which is the number of cycles of the divided VCO frequency that occur in a calibration interval, is determined by digital processing logic circuit 108. The calibration interval is equal to $Q/F_{ref}$, where "Q" is a division ratio used in digital processing logic circuit 108 and "$F_{ref}$" is the frequency of reference clock 130. The time between calibration intervals is selected to allow sufficient time for the frequency of VCO 102 to settle, which is required to achieve stability in auto-tuning circuit 104. At step 210, a determination is made as to whether comp_cnt is less than M•Q where "M" is a division ratio of an M counter in phase locked loop 100. If comp_cnt is not less than M•Q, the method proceeds to step 212, where value of bit(N) remains set to "1". If comp_cnt is less than M•Q, the method proceeds to step 216, where the value of bit(N) is set to "0".

At step 214, a determination is made as to whether any more bits of the capacitor array control signal remain to be calibrated, which is determined by whether N=0. If one or more bits of the capacitor array control signal remain to be calibrated (i.e. if N is not equal to "0"), the method proceeds to step 218. At step 218, N is decremented by "1" from its previous value and the method proceeds to step 220. At step 220, the value of bit(N) remaining to be calibrated is set to "1" and the current capacitor array control signal is provided to capacitor array 105. After step 220, the method proceeds back to step 206, where the current VCO frequency is divided by prescaler circuit 106 to begin another calibration loop. The calibration loop discussed above is repeated to calibrate each bit in the capacitor array control signal. If no more bits of the capacitor array control signal remain to be calibrated, the method proceeds to step 222, where the final capacitor array control signal is stored in digital processing logic circuit 108 and inputted into capacitor array 105. At step 224, the method of coarse tuning VCO 102 is completed.

Figure 3:
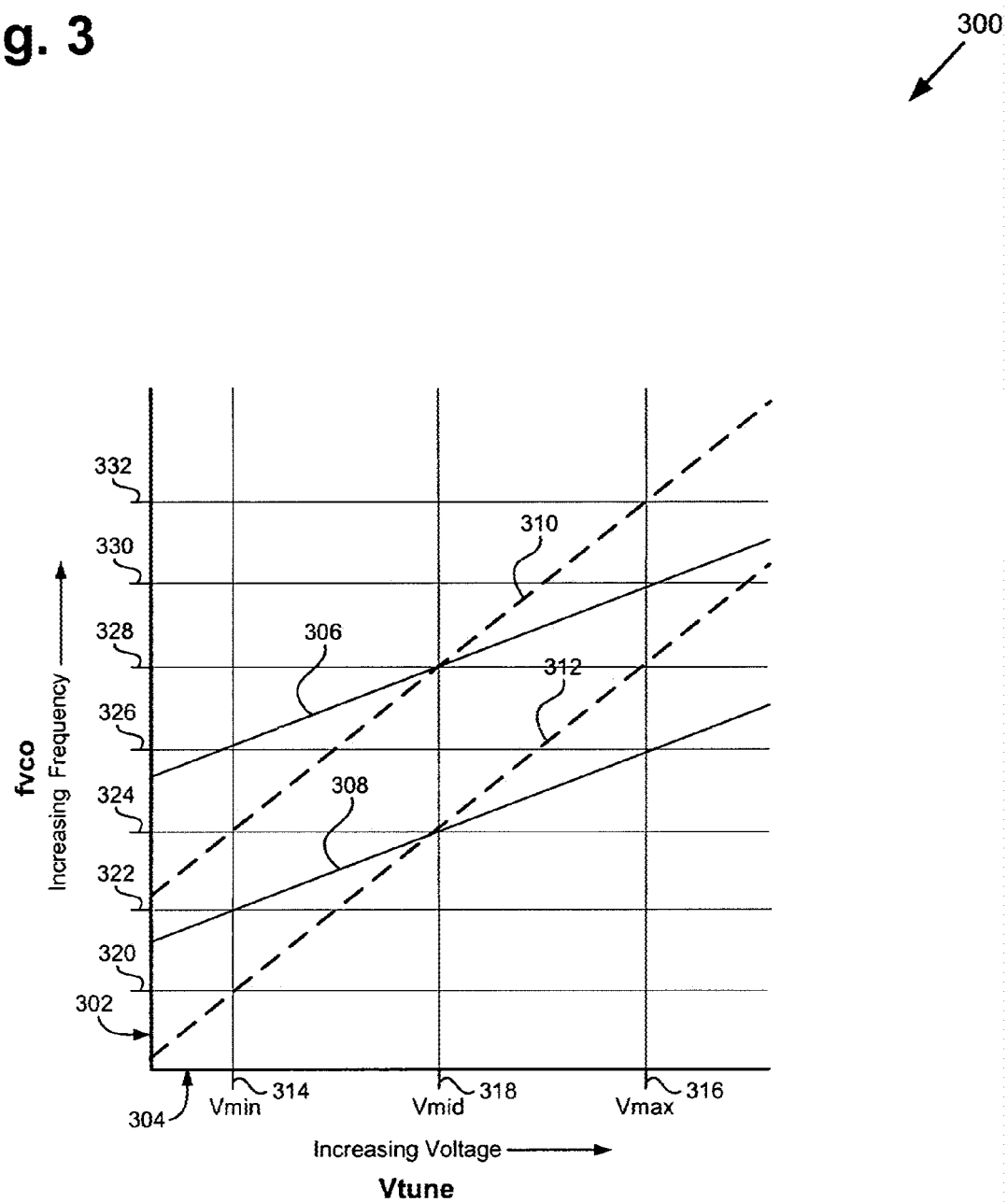
FIG. 3 is a graph showing exemplary VCO fine tuning curves in accordance with one embodiment of the present invention.

FIG. 3 shows exemplary graph 300 including exemplary VCO fine tuning curves in accordance with one embodiment of the present invention. Graph 300 includes VCO frequency ("fvco") axis 302, Vtune axis 304, and VCO fine tuning curves 306, 308, 310, and 312. In graph 300, fvco axis 302 corresponds to an exemplary fine tuning range of VCO 102 in FIG. 1, while Vtune axis 304 corresponds to an exemplary tuning voltage range of Vtune 138 in FIG. 1 during fine tuning of VCO 102.

In graph 300, VCO fine tuning curve 306 corresponds to a fine tuning frequency range of VCO 102 at a temperature of −30.0° C. between minimum voltage ("Vmin") 314 and maximum voltage ("Vmax") 316 of Vtune 138, where VCO 102 has been coarse tuned via auto-tuning circuit 104 using a voltage curve for Vref 126 that linearly increases between −30.0° C. and 90.0° C. VCO fine tuning curve 308 corresponds to a fine tuning frequency range of VCO 102 at a temperature of 90.0° C. between Vmin 314 and Vmax 316 of Vtune 138, where VCO 102 has been coarse tuned via auto-tuning circuit 104 using a voltage curve for Vref 126 that linearly increases between −30.0° C. and 90.0° C. VCO fine tuning curve 310 corresponds to a fine tuning frequency range of VCO 102 at a temperature of −30.0° C. between Vmin 314 and Vmax 316 of Vtune 138, where VCO 102 has been coarse tuned via auto-tuning circuit 104 using fixed mid-range voltage ("Vmid") 318 for Vref 126. VCO fine tuning curve 312 corresponds to a fine tuning frequency range of VCO 102 at a temperature of 90.0° C. between Vmin 314 and Vmax 316 of Vtune 138, where VCO 102 has been coarse tuned via auto-tuning circuit 104 using Vmid 318 for Vref 126.

In the example shown in graph 300, when Vtune 138 varies between Vmin 314 and Vmax 316, VCO fine tuning curve 306 varies between frequencies 326 and 330, VCO fine tuning curve 308 varies between frequencies 322 and 326, VCO fine tuning curve 310 varies between frequencies 324 and 332, and VCO fine tuning curve 312 varies between frequencies 320 and 328. However, as shown in the example in graph 300, the range of VCO fine tuning curve 310 between frequencies 324 and 332 is significantly greater than the range of VCO fine tuning curve 306 between frequencies 326 and 330, and the range of VCO fine tuning curve 312 between frequencies 320 and 328 is significantly greater than the range of VCO fine tuning curve 308 between frequencies 322 and 326.

Thus, as shown in the example in graph 300, by using a voltage curve for Vref 126 that increases linearly with increasing temperature during coarse tuning of VCO 102 by auto-tuning circuit 104, the present invention requires a significantly reduced VCO fine tuning range compared to a VCO fine tuning range required using a fixed voltage for Vref 126. Thus, by using a temperature compensated voltage for Vref 126 during coarse tuning of VCO 102 to reduce the required VCO fine tuning range, the present invention advantageously achieves improved VCO gain.

Thus, as discussed above, the present invention provides an auto-tuning circuit for coarse tuning a VCO, where the auto-tuning circuit comprises a digital processing logic circuit for determining a calibrated capacitor array control signal and a prescaler circuit having a selectable division ratio. By utilizing a prescaler circuit having a selectable division ratio to provide a divided VCO frequency, the present invention advantageously achieves an auto-tuning circuit having a higher resolution compared to a conventional coarse tuning circuit utilizing a fixed division ratio to divide the VCO frequency. Also, by providing an auto-tuning circuit that uses a prescaler circuit that is used for another function in the phase locked loop, the present invention advantageously provides an auto-tuning circuit that can be manufactured at reduced cost compared to a conventional coarse tuning circuit that utilizes a dedicated divider circuit for VCO frequency division.

Additionally, the present invention uses a simple algorithm for calibrating bits of the capacitor array control signal that can be easily implemented in the digital processing logic circuit. Furthermore, by appropriately defining the number of bits in the capacitor array, the present invention advantageously provides a balance between VCO coarse tuning resolution and time required to calibrate the bits of the capacitor array control signal. Moreover, by coarse tuning the VCO by using a temperature compensated voltage reference signal at the input of the VCO, the present invention advantageously achieves improved VCO gain.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a high resolution tuning circuit for a voltage controlled oscillator has been described.

What is claimed is:

1. An apparatus comprising:
   a prescaler circuit configured to receive a voltage controlled oscillator (VCO) output signal from a VCO and to generate a divided signal based on the VCO output signal;
   a counter module configured to generate, based on the divided signal, a feedback signal to be used for fine tuning the VCO in a fine tuning mode; and
   a digital processing logic circuit configured to receive the divided signal and a reference clock signal, to count a number of cycles of the divided signal that occur during a calibration interval having a duration that is about equal to a division ratio Q of the digital processing logic circuit divided by a frequency of the reference clock signal, and to set a value of a capacitor array control signal based on the number of cycles of the divided signal to cause the VCO output signal to reach a coarse tuning target frequency in a coarse tuning mode.

2. The apparatus of claim 1 wherein the digital processing logic circuit is further configured to set the value of the capacitor array control signal to an initial value, the capacitor array control signal including a plurality of bits.

3. The apparatus of claim 2 wherein the digital processing logic circuit is further configured to determine a final value of a first bit of the capacitor array control signal based on comparing the number of cycles counted to a product of a division control signal M and a division ratio Q when the capacitor array control signal is set to the initial value.

4. The apparatus of claim 1 wherein the number of cycles counted is approximately equal to a product of a division control signal M and a division ratio Q when the digital processing logic circuit has set the capacitor array control signal to a final value.

5. The apparatus of claim 1 wherein the prescaler circuit has a selectable division ratio, the counter module further configured to control a value of the selectable division ratio to be one of a first integer division value P or a second integer division value P+1, the first integer division value P about equal to a division ratio Q of the digital processing logic circuit.

6. A phase-locked loop (PLL) comprising:
   a capacitor array including a plurality capacitors digitally selectable by a capacitor array control signal;
   a voltage controlled oscillator (VCO) having a voltage input and configured to generate a VCO output signal, a frequency of the VCO output signal based on a voltage level at the voltage input and on a value of the capacitor array control signal;
   a prescaler circuit configured to receive the VCO output signal and to generate a divided signal based on the VCO output signal;
   a counter module configured to generate, based on the divided signal, a feedback signal to be used for fine tuning the VCO in a fine tuning mode; and
   a digital processing logic circuit configured to receive the divided signal and a reference clock signal, to count a number of cycles of the divided signal that occur during a calibration interval having a duration that is about equal to a division ratio Q of the digital processing logic circuit divided by a frequency of the reference clock signal, and to set the value of the capacitor array control signal based on the number of cycles of the divided signal to cause the VCO output signal to reach a coarse tuning target frequency in a coarse tuning mode.

7. The PLL of claim 6 wherein the digital processing logic circuit is further configured to generate a tuning control signal to configure the PLL between the fine tuning mode and the coarse tuning mode, the prescaler circuit configured to operate in both the fine tuning and coarse tuning modes, the digital processing logic circuit configured to operate in the coarse tuning mode.

8. The PLL of claim 7 wherein the VCO is configured to receive a reference voltage during the coarse tuning mode, the reference voltage proportional to temperature.

9. The PLL of claim 6 further comprising a phase-frequency detector (PFD) and charge pump module configured to receive the feedback signal and a reference clock signal, the PFD and charge pump module configured to generate a correction signal based on the feedback signal and the reference clock signal.

10. The PLL of claim 6 wherein the digital processing logic circuit is further configured to set the value of the capacitor array control signal to an initial value, the capacitor array control signal including a plurality of bits.

11. A phase-locked loop (PLL) comprising:
    a capacitor array including a plurality capacitors digitally selectable by a capacitor array control signal including a plurality of bits;
    a voltage controlled oscillator (VCO) having a voltage input and configured to generate a VCO output signal, a frequency of the VCO output signal based on a voltage level at the voltage input and on a value of the capacitor array control signal;
    a prescaler circuit configured to receive the VCO output signal and to generate a divided signal based on the VCO output signal;
    a counter module configured to generate, based on the divided signal, a feedback signal to be used for fine tuning the VCO in a fine tuning mode; and
    a digital processing logic circuit configured to receive the divided signal, to count a number of cycles of the divided signal that occur during a calibration interval, and to set the value of the capacitor array control signal based on the divided signal to cause the VCO output signal to reach a coarse tuning target frequency in a coarse tuning mode, the digital processing logic circuit configured to set the value of the capacitor array control signal by setting the value of the capacitor array control signal to an initial value and determining a final value of a first bit of the capacitor array control signal based on comparing the number of cycles counted to a product of a division control signal M and a division ratio Q when the capacitor array control signal is set to the initial value.

12. A phase-locked loop (PLL) comprising:
a capacitor array including a plurality capacitors digitally selectable by a capacitor array control signal;
a voltage controlled oscillator (VCO) having a voltage input and configured to generate a VCO output signal, a frequency of the VCO output signal based on a voltage level at the voltage input and on a value of the capacitor array control signal;
a prescaler circuit configured to receive the VCO output signal and to generate a divided signal based on the VCO output signal, the prescaler circuit having a selectable division ratio;
a counter module configured to generate, based on the divided signal, a feedback signal to be used for fine tuning the VCO in a fine tuning mode, and to control a value of the selectable ratio to be one of a first integer division value P and a second integer division value P+1; and
a digital processing logic circuit configured to receive the divided signal and to set the value of the capacitor array control signal based on the divided signal to cause the VCO output signal to reach a coarse tuning target frequency in a coarse tuning mode, the first integer division value P about equal to a division ratio Q of the digital processing logic circuit.

13. A method of tuning a phase-locked loop (PLL), the method comprising:
generating a voltage controlled oscillator (VCO) output signal using a VCO coupled to a capacitor array, a frequency of the VCO output signal based on an input voltage of the VCO and on a value of a capacitor array control signal of the capacitor array;
dividing the VCO output signal to generate a divided signal using a prescaler circuit;
counting a number of cycles of the divided signal that occur during a calibration interval having a duration that is about equal to a division ratio Q of a digital processing logic circuit divided by a frequency of a reference clock signal;
generating, using a counter module based on the divided signal, a phase-frequency detector (PFD) feedback signal to be used for fine tuning the VCO in a fine tuning mode; and
determining, using the digital processing logic circuit, the value of the capacitor array control signal based on the number of cycles of the divided signal to cause the VCO output signal to reach a coarse tuning target frequency in a coarse tuning mode.

14. A method of tuning a phase-locked loop (PLL), the method comprising:
generating a voltage controlled oscillator (VCO) output signal using a VCO coupled to a capacitor array, a frequency of the VCO output signal based on an input voltage of the VCO and on a value of a capacitor array control signal of the capacitor array;
dividing the VCO output signal to generate a divided signal using a prescaler circuit;
counting a number of cycles of the divided signal that occur during a calibration interval;
generating, using a counter module based on the divided signal, a phase-frequency detector (PFD) feedback signal to be used for fine tuning the VCO in a fine tuning mode; and
determining, using a digital processing logic circuit, the value of the capacitor array control signal based on the number of cycles of the divided signal to cause the VCO output signal to reach a coarse tuning target frequency in a coarse tuning mode, determining the value of the capacitor array control signal including setting the value of the capacitor array control signal to an initial value, and determining a final value of a first bit of the capacitor array control signal based on comparing the number of cycles counted to a product of a division control signal M and a division ratio Q when the capacitor array control signal is set to the initial value.

15. The apparatus of claim 1 wherein the duration is equal to the division ratio Q of the digital processing logic circuit divided by the frequency of the reference clock signal.

16. The PLL of claim 6 wherein the duration is equal to the division ratio Q of the digital processing logic circuit divided by the frequency of the reference clock signal.

17. The method of claim 13 wherein the duration is equal to the division ratio Q of the digital processing logic circuit divided by the frequency of the reference clock signal.

* * * * *